(12) United States Patent
Ando et al.

(10) Patent No.: US 9,217,196 B2
(45) Date of Patent: Dec. 22, 2015

(54) METHOD FOR FORMING DLC FILM ON SPLINE SHAFT AND HOT CATHODE PIG PLASMA CVD DEVICE

(75) Inventors: Junji Ando, Anjo (JP); Tomoo Suzuki, Aichi (JP); Tomoki Ogawa, Kariya (JP); Akinori Iwai, Kariya (JP); Nobuyoshi Yoshimura, Okazaki (JP); Hiroyuki Hashitomi, Anjo (JP)

(73) Assignees: JTEKT Corporation, Osaka-shi (JP); CNK Co., Ltd., Kariya-shi (JP)

( * ) Notice: Subject to any disclaimer, the term of this patent is extended or adjusted under 35 U.S.C. 154(b) by 263 days.

(21) Appl. No.: 13/594,133

(22) Filed: Aug. 24, 2012

(65) Prior Publication Data

US 2013/0220798 A1 Aug. 29, 2013

(30) Foreign Application Priority Data

Aug. 26, 2011 (JP) ................................. 2011-184372

(51) Int. Cl.
| | |
|---|---|
| *H05H 1/24* | (2006.01) |
| *C23C 14/06* | (2006.01) |
| *C23C 16/26* | (2006.01) |
| *C23C 16/458* | (2006.01) |
| *C23C 16/50* | (2006.01) |
| *F16D 3/06* | (2006.01) |
| *F16C 3/03* | (2006.01) |
| *H01J 37/32* | (2006.01) |

(52) U.S. Cl.
CPC ............. *C23C 14/0611* (2013.01); *C23C 16/26* (2013.01); *C23C 16/458* (2013.01); *C23C 16/50* (2013.01); *F16C 3/03* (2013.01); *F16D 3/06* (2013.01); *H01J 37/32669* (2013.01); *F16C 2206/04* (2013.01); *F16C 2326/06* (2013.01); *F16D 2250/0046* (2013.01); *F16D 2300/10* (2013.01)

(58) Field of Classification Search
CPC ...... C23C 16/042; C23C 16/26; C23C 16/50; C23C 16/515; C23C 16/458; C23C 14/0611; H01J 37/34; H01J 37/3447; F16C 3/03; F16C 2206/04
USPC .......................................................... 427/569
See application file for complete search history.

(56) References Cited

U.S. PATENT DOCUMENTS

| | | | |
|---|---|---|---|
| 2007/0149299 A1 | 6/2007 | Azuma et al. | |
| 2010/0210488 A1* | 8/2010 | Suzuki et al. ................. | 508/100 |
| 2012/0034393 A1* | 2/2012 | Ando et al. .................... | 427/569 |

FOREIGN PATENT DOCUMENTS

| | | |
|---|---|---|
| CN | 102373437 A | 3/2012 |
| EP | 2 415 900 A1 | 2/2012 |

(Continued)

OTHER PUBLICATIONS

Extended European Search Report issued Jan. 4, 2013 in Patent Application No. 12181627.6.

(Continued)

*Primary Examiner* — Kelly M Gambetta
(74) *Attorney, Agent, or Firm* — Oblon, McClelland, Maier & Neustadt, L.L.P.

(57) ABSTRACT

Plural spline shafts are arranged around columnar plasma, and plural spline shafts are coaxially aligned in a direction that the columnar plasma extends within a vacuum chamber. The plural coaxially aligned spline shafts are positioned so that axial gap is formed between the respective male spline sections. The axial gap of the plural male spline sections is positioned at a center of the columnar plasma in the direction that the columnar plasma extends.

6 Claims, 8 Drawing Sheets

(56) References Cited

FOREIGN PATENT DOCUMENTS

| | | | |
|---|---|---|---|
| JP | 2006-169589 | | 6/2006 |
| JP | 2006169589 A | * | 6/2006 |
| JP | 2011-122663 | | 6/2011 |

OTHER PUBLICATIONS

Office Action issued Sep. 6, 2015 in Chinese Patent Application No. 201210305330.2 (with English translation).

* cited by examiner

THICKNESS OF DLC FILM

CIRCUMFERENTIAL DIRECTION

THICKNESS OF DLC FILM

METHOD FOR FORMING DLC FILM ON SPLINE SHAFT AND HOT CATHODE PIG PLASMA CVD DEVICE

INCORPORATION BY REFERENCE

The disclosure of Japanese Patent Application No. 2011-184372 filed on Aug. 26, 2011 including the specification, drawings and abstract is incorporated herein by reference in its entirety.

BACKGROUND OF THE INVENTION

1. Field of the Invention

The present invention relates to a method for forming a DLC (diamond like carbon) film on a male spline section of a spline shaft by utilizing a hot cathode PIG plasma CVD device, and also to a hot cathode PIG plasma CVD device.

2. Description of the Related Art

In propeller shafts used in vehicles for example, two shafts are mated to each other by splines to permit axial sliding movement. The spline sections require slide capability and wear resistance. The forming of a DLC (diamond like carbon) film on these spline sections to meet such requirements is known in the related art (See Japanese Patent Application Publication No. 2011-122663 (JP 2011-122663 A)).

Methods for forming the DLC film are known to include CVD (chemical vapor deposition) methods, PVD (physical vapor deposition) methods, ion vapor deposition methods, etc. The CVD methods also include a hot cathode PIG (Penning Ionization Gauge) plasma CVD method (see Japanese Patent Application Publication No. 2006-169589 (JP2006-169589 A)) that uses a hot cathode PIG plasma source.

Generally, plural spline shafts are placed inside a device and a DLC film is formed simultaneously on the male spline sections of the plural spline shafts. Irregularities in film thickness of the DLC film formed on the respective male spline sections are preferably reduced in order to lower individual variations in performance among the plural male spline sections.

SUMMARY OF THE INVENTION

The present invention provides a method for forming a DLC film on spline shafts that is capable of reducing variations in the thickness of the DLC film when the DLC film is formed on male spline sections by the hot cathode PIG plasma CVD method and a hot cathode PIG plasma CVD device.

A first aspect of the method for forming a DLC film on spline shafts according to the invention is a method for forming a DLC film on the male spline section of the spline shaft by a hot cathode PIG plasma CVD device. The hot cathode PIG plasma CVD device used in the method includes: i) a vacuum chamber that accommodates the spline shafts, ii) a plasma gun, iii) a reflecting electrode arranged in the vacuum chamber, iv) a first coil arranged so as to surround the plasma gun, v) a second coil arranged on the reflecting coil side, the second coil facing the first coil, vi) a hot cathode PIG plasma source that forms a columnar plasma with a bulged center in the vacuum chamber, vii) a material gas feed section that supplies material gas into the vacuum chamber, the material gas serving as a material for the DLC film. The above method includes: arranging the plural spline shafts in the vacuum chamber around the columnar plasma, aligning the plural spline shafts coaxially in the direction that the columnar plasma extends, arranging the plural coaxially aligned spline shafts to form an axial gap between the respective male spline sections, and positioning the axial gap of the male spline sections at a center of columnar plasma in the direction that the columnar plasma extends.

The present inventors took notice of the fact that there is a correlation between the thickness of the DLC film and the bulge in the center of the columnar plasma formed in the vacuum chamber. More specifically, the inventors perceived a relation where the thickness of the DLC film becomes greater as a position is closer to the larger bulge of the plasma. Therefore, the axial gap of the plural male spline sections aligned in the direction that the columnar plasma extends is positioned at the center of the columnar plasma in the direction that the columnar plasma extends. That is, no male spline section is placed at the center of the columnar plasma in the direction that the columnar plasma extends. In other words, the center where the plasma bulge is largest is not used in processing to form the DLC film on the male spline sections. Therefore, sections other than the center of the plasma are used in the processing to form DLC film on the male spline sections. As a result, it is possible to reduce variations in the thickness of the DLC film on the male spline sections.

In the embodiment of the present invention, an even number of spline shafts may be aligned in the vacuum chamber in the direction that the columnar plasma extends.

The bulge of the plasma is largest at the center, and the bulge of the plasma becomes smaller toward the edges. The embodiment of the present invention is capable of reducing the variations in the thickness of the DLC film and effectively utilizing both edges of the plasma by aligning an even number of plural spline shafts. That is, many spline shafts can be arranged within the vacuum chamber, and the DLC film can be formed on many male spline sections of the spline shafts all at one time.

Moreover, the spline shaft used in the embodiment of the present invention may include: a male spline section, and a yoke section that is formed in a U-shape, that is capable of coupling to other member, and that joins with the male spline section into one piece after being formed as a peace separate from the spline section. Only the male spline sections of the spline shafts may be placed within the vacuum chamber. Four or more male spline sections may be aligned within the vacuum chamber in the direction that the columnar plasma extends. Also, two male spline sections that are placed near the center of the columnar plasma in the direction that the columnar plasma extends may be positioned so as to form an axial gap between the two male spline sections. Two male spline sections that are positioned outside the center of the columnar plasma in the direction that the columnar plasma extends may be positioned while abutting each other.

By arranging the male spline sections of the two spline shafts in an abutting state at a position other than the center of the columnar plasma in the direction that the columnar plasma extends, many male spline sections of the spline shafts can be securely placed within the vacuum chamber.

Moreover, the spline shaft in the above embodiment may include a male spline section, and a yoke section that is formed in a U-shape and capable of coupling to other member and integrally formed into one piece with the male spline section. The plural spline shafts that are aligned within the vacuum chamber in the direction that the columnar plasma extends, may be arranged such that the respective yoke sections face and overlap each other in an axial direction. The respective yoke sections may be placed at the axial gap between the respective male spline sections that is positioned at the center of the columnar plasma in the direction that the columnar plasma extends.

There is no need to form a DLC form on the yoke section if the spline shaft includes the male spline section and the yoke section formed as an integrated piece with the male spline section, therefore the region for the yoke section within the vacuum chamber is wasted. However, by arranging the respective yoke sections of the plural spline shafts such that the respective yoke sections face and overlap each other in the axial direction, those regions on which a DLC film is not required to form can be narrowed as much as possible. Moreover, by placing the respective overlapping yoke sections facing each other at the center of the columnar plasma in the direction that the columnar plasma extends, the axial gap between the plural male spline sections can be effectively utilized. Since the interior of the vacuum chamber can be effectively utilized, the variations in the thickness of the DLC film can be reduced and many spline shafts can be placed within the vacuum chamber.

Also in the above embodiment, the plural spline shafts that are aligned in the direction that the columnar plasma extends such that the respective yoke sections face each other may be set as a first group, the plural spline shafts that are aligned in the direction that the columnar plasma extends such that the respective yoke sections face outwards may be set as a second group, and the first and second groups may be alternately arranged in the circumferential direction around the columnar plasma.

In all the plural spline shafts that are arranged in the circumferential direction within the vacuum chamber, if the respective yoke sections are arranged to face and to overlap each other in the axial direction, then it is necessary to widen the gap in the circumferential direction so that the adjacent yoke sections in the circumferential direction do not come in contact with each other. However, in the above embodiment, the circumferential gap can be narrowed by alternately arranging the first group whose yoke sections are positioned facing each other and the second group whose yoke sections are positioned facing outwards. That is, many spline shafts can be positioned in the circumferential direction within the vacuum chamber.

Moreover, in this embodiment, the male spline section in the first group and the male spline section in the second group may be arranged at same position in the direction that the columnar plasma extends.

By arranging the respective male spline sections at the same position in the direction that the columnar plasma extends, when the first group and second group are alternately arranged in the circumferential direction, the variations in the thickness of the DCL film of the male spline sections in the first group and the thickness of the DCL film of the male spline sections in the second group can be reduced.

The hot cathode PIG plasma CVD device according to a second aspect of the present invention includes: a vacuum chamber that accommodates a spline shaft; a plasma gun; a reflecting electrode arranged within the vacuum chamber; a first coil arranged so as to surround the plasma gun; a second coil arranged on the reflecting electrode side, the second coil facing the first coil; a hot cathode PIG plasma source that forms a columnar plasma with a bulged center in the vacuum chamber; and a material gas feed section that supplies material gas into the vacuum chamber, the material gas serving as a material for the DLC film. The vacuum chamber is configured such that: i) the plural spline shafts are arranged around the columnar plasma, ii) the plural spline shafts are coaxially aligned in a direction that the columnar plasma extends, iii) the plural coaxially aligned spline shafts are arranged so as to form an axial gap between the respective male spline sections, and iv) the axial gap of the male spline sections is positioned at a center of the columnar plasma in the direction that the columnar plasma extends.

BRIEF DESCRIPTION OF THE DRAWINGS

Features, advantages, and the technical and industrial significance of exemplary embodiments of the invention will be described below with reference to the accompanying drawings, in which like numerals denote like elements, and wherein.

DETAILED DESCRIPTION OF EMBODIMENTS

A spline shaft of the first embodiment of the present invention is described next utilizing a first shaft of a vehicular propeller shaft as an example. The structure of the propeller shaft is described with reference to FIG. 1 through FIG. 4. A propeller shaft 1 is a shaft for transmitting driving force from an engine to a differential device. There are different drive systems but the propeller shaft 1 includes a front propeller shaft and a rear propeller shaft. These components in any case, link the engine to the differential device and are positioned extending to the vehicle front and rear directions.

Figure 1:
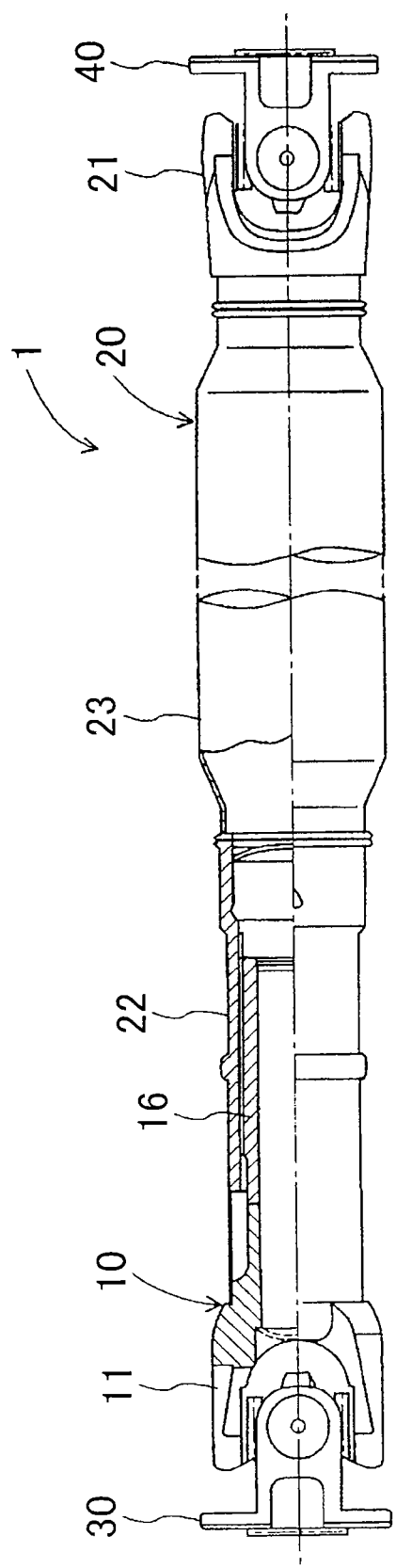
FIG. 1 is a partial cross sectional view showing the overall structure of a propeller shaft including a first shaft serving as a spline shaft of the embodiment of the present invention.

As shown in FIG. 1, the propeller shaft 1 includes a first shaft 10, and a second shaft 20 placed to allow axial sliding movement relative to the first shaft 10. For example, the first shaft 10 is linked to a member 30 on the engine side, and the second shaft 20 is linked to a member 40 on the differential device side.

Figure 2:
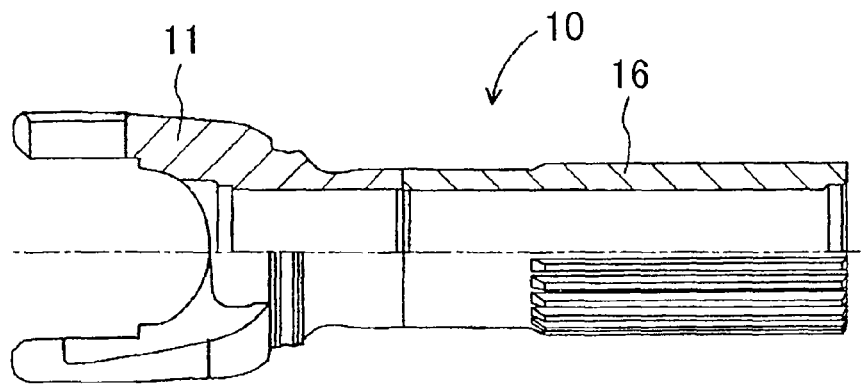
FIG. 2 is a view showing the first shaft configuring the propeller shaft of FIG. 1.

As shown in FIG. 1 and FIG. 2, the first shaft 10 includes a first yoke section 11, and a male spline section 16. The first yoke section 11 is a part of a universal joint coupled to another member 30 at an applied angle. The tip of the first yoke section 11 is formed in a U shape opening toward the left side in FIG. 2. The male spline section 16 is formed in a cylindrical shape and is joined into one piece at the U-shaped bottom of the first yoke section 11 and is positioned coaxially with the first yoke section 11.

The second shaft 20 includes a second yoke section 21, a female spline section 22, and an intermediate tube section 23. These components are formed into one piece by friction welding after separately forming each of the components. The second yoke section 21 of the second shaft 20 is a part of the universal joint coupled to another member 40 at an applied angle. The tip of the second yoke section 21 is formed in a U shape opening toward the right side in FIG. 1. The female spline section 22 of the second shaft 20 mates with the male spline section 16 of the first shaft 10 by spline-fitting, and is capable of axial sliding movement relative to the male spline section 16. The intermediate tube section 23 is coaxially and integrally joined to the second yoke section 21 and the female spline section 22.

Figure 3:
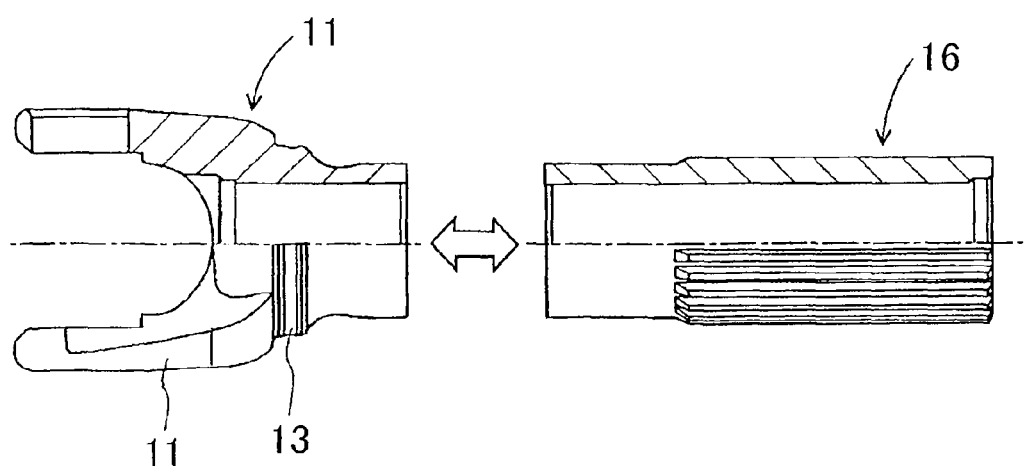
FIG. 3 is a view showing the two-section member configuring the first shaft of FIG. 2 prior to integration by friction pressure welding.
Figure 4:
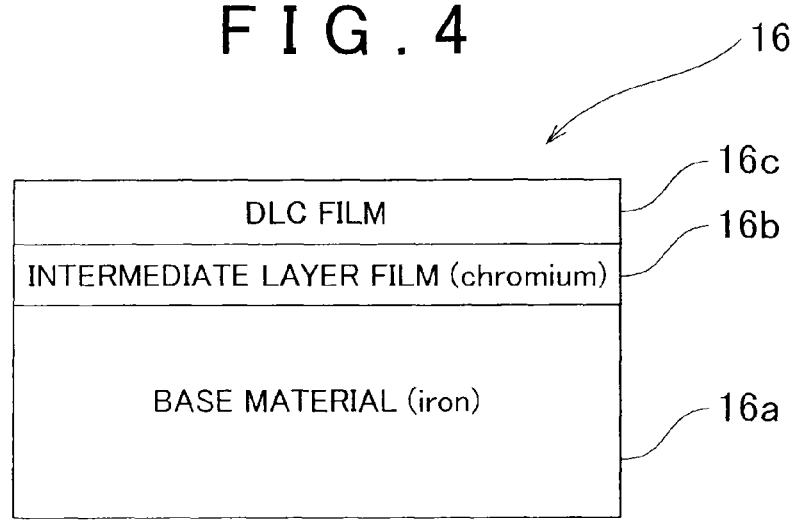
FIG. 4 is a cross sectional view showing the surface side of a male spline section of the first shaft shown in FIG. 3.

In this embodiment, as shown in FIG. 2 and FIG. 3, after forming the first yoke section 11 and the male spline section 16 as separate parts, the first shaft 10 is formed by friction welding from both members into one piece. The male spline section 16 of the first shaft 10 is surface treated in order to improve sliding capability and wear resistance. As shown in FIG. 4, the male spline section 16 contains a base material 16a having iron as the main constituent, an intermediate layer film 16b having chromium as the main constituent, and a DLC film 16c. The intermediate layer film 16b is formed on the surface of the base material 16a. The DLC film 16c is formed on the surface of the intermediate layer film 16b. The intermediate layer film 16b is formed by the PVD method and by the sputtering method in particular. The DLC film 16c is formed by the hot cathode PIG plasma CVD method. The DLC film 16c on the surface side of the male spline section 16 has graded composition whose silicon (Si) content becomes lower the closer to the surface.

Next, a hot cathode PIG plasma device 50 for surface treating the male spline section 16 of the first shaft 10 is described with reference to FIG. 5 and FIG. 6. The hot cathode PIG plasma device 50 is a device for forming the intermediate layer film 16b by the PVD method on the surface of the base material 16a of the male spline section 16; and also forming a DLC film 16c by the CVD method while emitting hot cathode PIG plasma.

Figure 5:
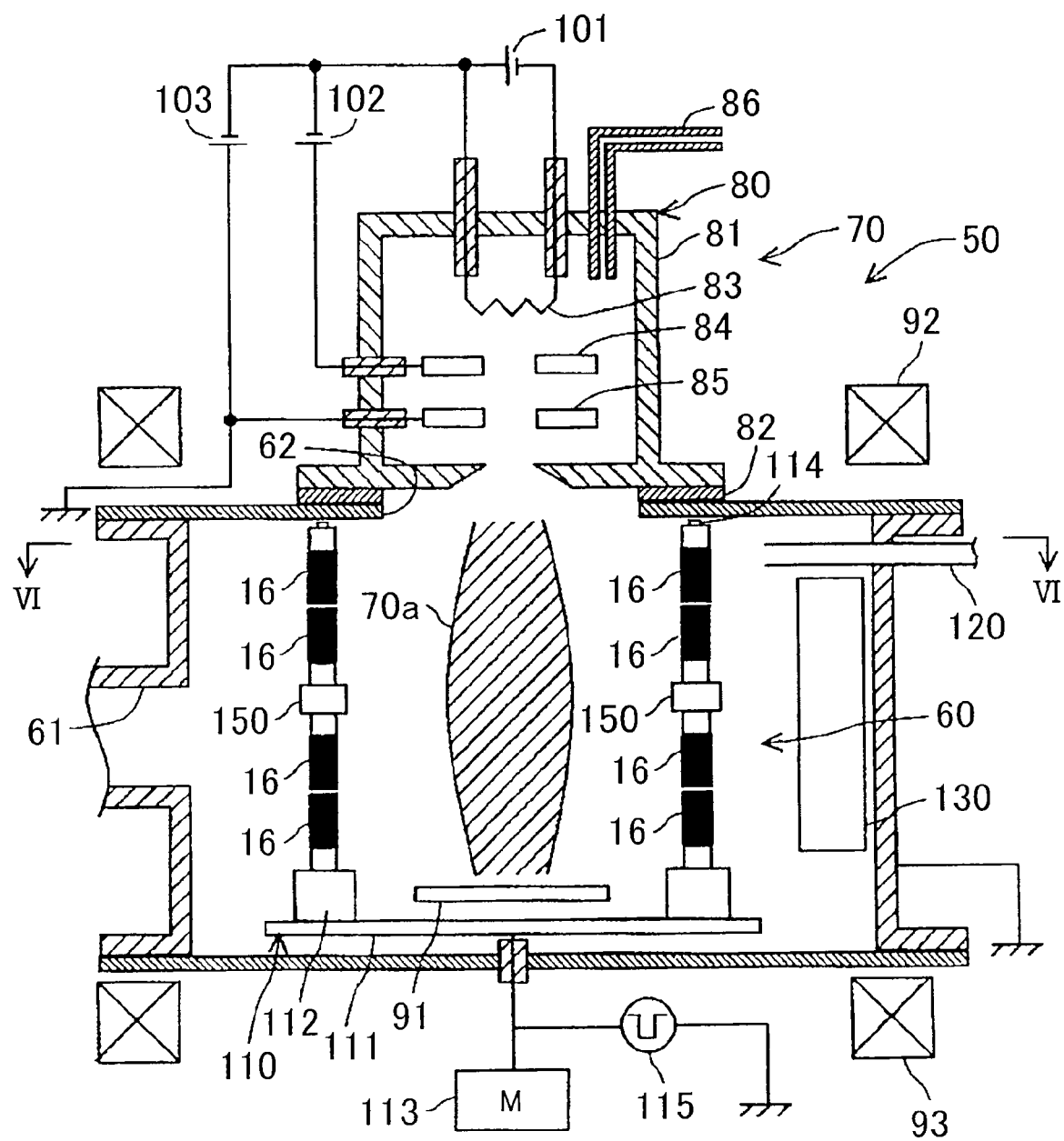
FIG. 5 is a view showing a hot cathode PIG plasma device of the first embodiment for performing surface treatment of the male spline section shown in FIG. 3.
Figure 6:
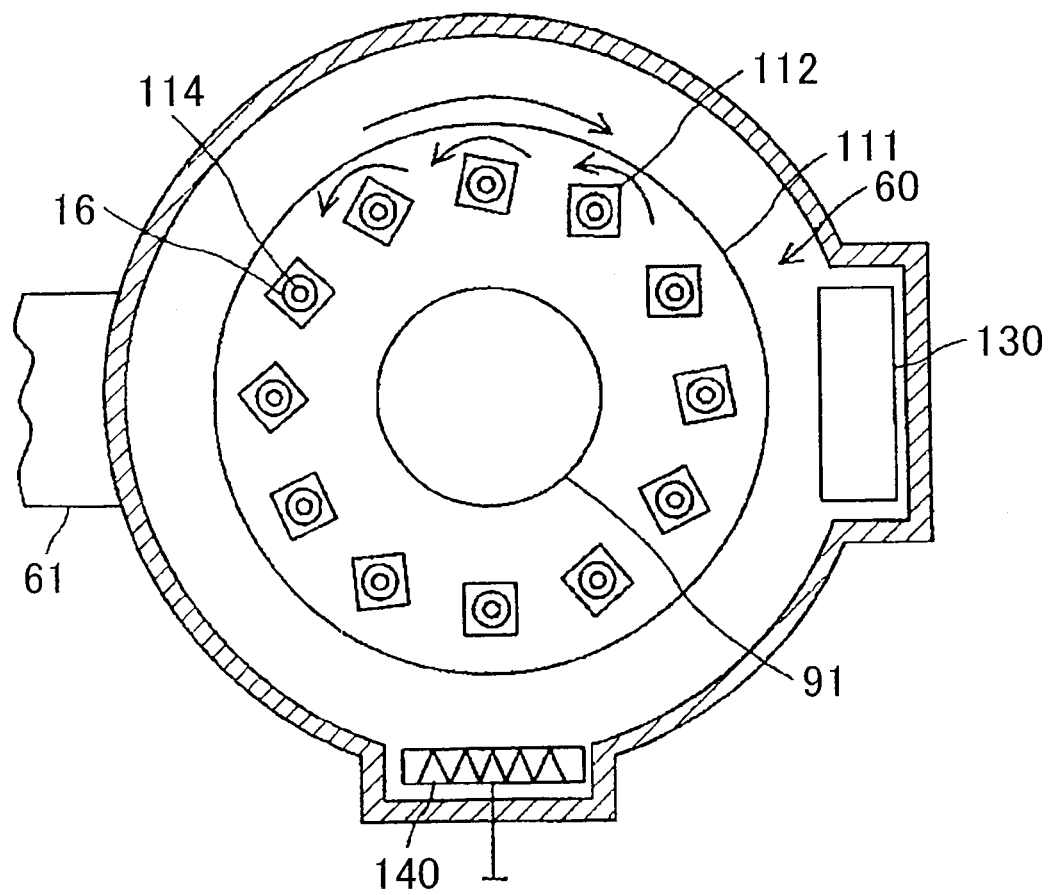
FIG. 6 is a radial cross sectional view of the hot cathode PIG plasma device taken along the line VI-VI of the cross sectional view in FIG. 5.

As shown in FIGS. 5 and 6, the hot cathode PIG plasma device 50 includes a vacuum chamber 60, a hot cathode PIG plasma source 70, a support device 110, a material gas feed section 120, a sputter source 130, and a heater 140.

The vacuum chamber 60 is formed in a cylindrical shape from metal possessing high corrosion resistance and high heat resistance such as stainless steel. The wall section of the vacuum chamber 60 is connected to ground (GND) potential. In FIG. 5, an exhaust opening 61 is formed in the outer peripheral wall at a position away from the center axis. An opening 62 to supply plasma is formed on the edge wall surface (upper edge wall surface in FIG. 5) along the center axis of the vacuum chamber 60. Plural male spline sections 16 serving as the object for surface treatment are positioned within the vacuum chamber 60.

The hot cathode PIG plasma source 70 forms a columnar-shaped plasma 70a bulging in the center section within the vacuum chamber 60. This hot cathode PIG plasma source 70 includes a plasma gun 80, a reflecting electrode 91, a first coil 92, and a second coil 93.

The plasma gun 80 is arranged outside the opening 62 of vacuum chamber 60. The plasma gun 80 includes a housing 81, an insulator 82, a hot cathode 83, an anode 84, an electron injection electrode 85, and a gas nozzle 86. The housing 81 is formed in a tubular shape, for example, and made of stainless steel. The housing 81 is provided so as to cover the opening 62 of vacuum chamber 60. An insulator 82 made of fluorine resin or alumina, is interposed between the housing 81 and the vacuum chamber 60.

The hot cathode 83, anode 84, and electron injection electrode 85 are arranged within the housing 81. For example, the hot cathode 83 is made of a tungsten filament. The hot cathode 83 is arranged at a position (top end of FIG. 5) farthest from the opening 62 in the housing 81. The hot cathode 83 is connected to a direct current power supply 101, and is heated by the direct current power (cathode electric power) from the direct current power supply 101. The hot cathode 83 emits thermo electrons by heating the hot cathode 83 to a temperature that causes the emission of thermo electrons.

The anode 84 is formed in a flat ring shape and made of molybdenum. The anode 84 is arranged between the hot cathode 83 and the opening 62 so that the hollow part faces the opening 62. An anode power supply 102 applies a voltage to the anode 84 that is positive relative to the hot cathode 83. The electron injection electrode 85 is formed in the same manner as the anode 84, is connected to the hot cathode 83 via the electron injection power supply 103, and is also grounded. Moreover, the hot cathode 83, the anode 84, and the electron injection electrode 85 are suspended relative to the housing 81 of the plasma gun 80.

The gas nozzle 86 feeds discharge gas, such as argon gas and hydrogen gas, from outside of the housing 81 into the interior of the housing 81. In other words, plasma is generated within the housing 81 by supplying electrical power to the hot cathode 83, the anode 84 and the electron injection electrode 85 and supplying discharge gas from the gas nozzle 86.

The reflecting electrode 91 is made of steel or stainless steel and positioned within the vacuum chamber 60 so as to face the plasma gun 80. The reflecting electrode 91 reflects the particles of the plasma 70a supplied from the plasma gun 80 into the vacuum chamber 60, toward the plasma gun 80 side. The reflecting electrode 91 is at the insulation voltage potential.

The first coil 92 is arranged so as to surround the periphery of the housing 81 of the plasma gun 80, and positioned so as to face the external surface of one edge wall surface (top side surface in FIG. 5) of the vacuum chamber 60. The first coil 92 generates a magnetic field by being supplied with a direct current to promote electric discharge within the housing 81 of the plasma gun 80. The second coil 93 is positioned to face the first coil 92, and is positioned so as to face the external surface of the other edge wall surface (bottom side surface in FIG. 5) of vacuum chamber 60. In other words, the second coil 93 is positioned on the reflecting electrode 91 side. This second coil 93 generates a magnetic field in a columnar shape (beam shape) by being supplied with a direct current for confining the plasma 70a in the vacuum chamber 60. Namely, the plasma 70a has a columnar shape and both ends of the plasma 70a locate the reflecting electrode 91 and opening 62 respectively. The plasma 70a has a bulged shape at the center section extending in the direction the column extends.

The support device 110 is provided on the other edge wall surface side (bottom side in FIG. 5) within the vacuum chamber 60. The support device 110 is capable of supporting the plural male spline sections 16 around the plasma 70a. As shown in FIG. 5 and FIG. 6, the support device 110 includes a first rotating stand 111, a second rotating stand 112, a motor 113, a support 114, and a pulse power supply device 115. The first rotating stand 111 is formed in a disk shape and provided to allow rotation relative to the wall surfaces of the vacuum chamber 60. The first rotating stand 111 is rotated by driving the motor 113. A plurality of the second rotating stands 112 are provided on the first rotating stand 111 in a circumferential direction and are able to rotate with respect to the first rotating stand 111. A gear mechanism makes the second rotating stands 112 rotate along with rotation of the first rotating stand 111. A support 114 is fixed onto the second rotating stand 112. The support 114 is able to insert through the plural male spline sections 16. That is, driving the motor 113 causes the male spline sections 16 to revolve around the center of the first rotating stand 111, and also to rotate around the center of the support 114.

A pulse power supply device 115 is mounted outside the vacuum chamber 60, and the pulse power supply device 115 applies an asymmetrical pulse voltage as the bias voltage via the first rotating stand 111, second rotating stands 112, and support 114 to the male spline section 116.

The material gas feed section 120 is provided on the outer peripheral wall of vacuum chamber 60. The material gas feed section 120 supplies TMS (tetramethylsilane) gas and acetylene gas from outside the vacuum chamber 60 into the vacuum chamber 60 in order to form the DLC film on the surface of the male spline section 16. The sputter source 130 is arranged in the vicinity of the outer peripheral wall within the vacuum chamber 60. The target of the applicable sputter source 130 is made of a material whose main constituent is chrome. The heater 140 is arranged in the vicinity of the outer peripheral wall within the vacuum chamber 60 and is used to heat the male spline section 16 serving as the object for processing.

Next, the placement of the plural male spline sections 16 within the vacuum chamber 60 is described with reference to FIG. 5 and FIG. 6. Four male spline sections 16 are inserted through the respective supports 114. That is, along with arranging a plurality of male spline sections 16 around the plasma 70 in the vacuum chamber 60, a plurality of male spline sections are arranged coaxially in the direction that the column of plasma 70a extends.

More specifically, a plurality of male spline sections 16 are placed within the vacuum chamber 60 as described below. First of all, the first male spline section 16 is inserted into the respective support 114 from the surface of the side joining to the first yoke section 11 in the male spline section 16. The second male spline section 16 is then inserted into the support 114 from the surface opposite to the side joining with the first yoke section 11 in the male spline section 16. Here, the surfaces of the first male spline section 16 and the second male spline section 16 abuts each other on the side opposite to the first yoke section 11.

After the second male spline section 16 is inserted, the cylindrical spacer 150 is inserted into the support 114. Next, the third male spline section 16 is inserted into the support 114 from the surface of the side joining to the first yoke section 11 in the male spline section 16. Then, the fourth male spline section 16 is inserted into the support 114 from the surface opposite to the side joining to the first yoke section 11. Here, the surfaces of the third male spline sections 16 and the fourth male spline section 16 abuts each other on the side opposite to the first yoke section 11.

Accordingly, the four male spline sections 16 are coaxially aligned in a row so as to form an axial gap between the second and the third male spline sections 16 near the center of the arranged four male spline sections 16. Two sets of two male spline sections 16 are arranged to sandwich the spacer 150. By doing so, the axial gap between the male spline sections 16 where the spacer 150 is placed, is positioned in the center in the direction that the plasma 70a extends. That is, the spacer 150 is positioned around the largest bulged portion in the center of the plasma 70a and no male spline section 16 is arranged around the largest bulged portion of the plasma 70a.

Figure 7:
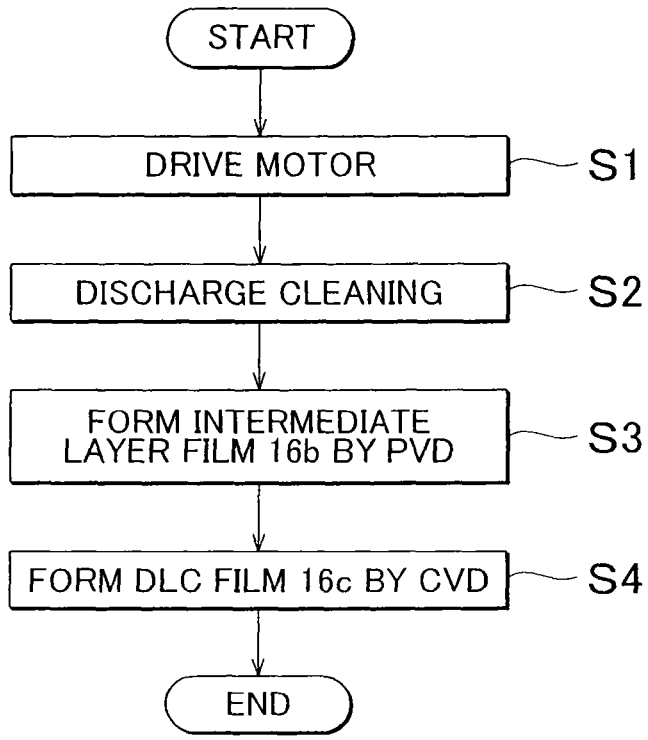
FIG. 7 is a flowchart showing a surface treatment method for the male spline section shown in FIG. 3 utilizing the device shown in FIG. 5.

Next, the method for surface treating the male spline section 16 is described with reference to the flowchart in FIG. 7. First, in step S1, the motor 113 is driven, electric power is supplied to the heater 140 to heat the male spline section 16 serving as the object for processing. In this way, the degassing of the male spline section 16 is performed.

Then in step S2, the electric power to the heater 140 is stopped, and discharge cleaning process is performed. In the discharge cleaning process, argon gas and hydrogen gas are supplied from the gas nozzle 86 to the housing 81 of the plasma gun 80. Moreover, in this step, electric power is supplied to the hot cathode 83, the anode 84, the electron injection electrode 85, the first coil 92, and the second coil 93. By doing so, thermo electrons are emitted by heating the hot cathode 83, and the speed of thermo electrons is accelerated toward the anode 84. The accelerated thermo electrons collide with the argon gas particles and the hydrogen gas particles, and the collision ionizes the argon gas particles and the hydrogen gas particles to generate plasma within the housing 81.

The plasma generated in the housing 81 is supplied from the opening 62 to the vacuum chamber 60, and the plasma moves toward the reflecting electrode 91. However, the reflecting electrode 91 is at insulation voltage potential so that the electrons within the plasma are reflected by the reflecting electrode 91 and moves toward the plasma gun 80. However, the housing 81 of plasma gun 80 is also at insulation voltage potential so that the electrons within the plasma are oscillated in the electrical field between the plasma gun 80 and the reflecting electrode 91. Moreover, magnetic fields generated by the first coil 92 and the second coil 93 confine the plasma 70a in a columnar shape, and the columnar plasma 70a that is bulged in the center of the plasma 70a is generated within the vacuum chamber 60.

The pulse power supply device 115 applies a bias voltage to the male spline section 16. Therefore, the argon ions and hydrogen ions in the plasma 70a collide with the surface of the male spline section 16. In this way, the surface of the male spline section 16 is cleaned. The supply of hydrogen gas is stopped when the cleaning is finished.

Next, in step S3, the intermediate layer film 16b is formed by the sputtering method which is one of PVD methods. Electrical power is supplied to target of the sputter source 130. Then, argon ions collide with the surface of the target to forcefully expel the chrome particles from the target. The chrome particles collide with the surface of the male spline section 16 and accumulate on that surface. In this way, the intermediate layer film 16b with chrome as the main constituent is formed on the surface of the base material 16a of the male spline section 16. Then, the supply of electrical power to the target of the sputter source 130 is stopped.

Next, in step S4, the DLC film 16c is formed by the hot cathode PIG plasma CVD method. The material gas feed section 120 supplies TMS gas and acetylene gas into the vacuum chamber 60. Then, the plasma 70a ionizes the TMS gas and acetylene gas to form plasma in the vacuum chamber 60. The plasma generated from the TMS gas and acetylene gas causes a chemical reaction on the surface of the male spline section 16 to form the DLC film 16c containing silicon (Si).

Figure 8:
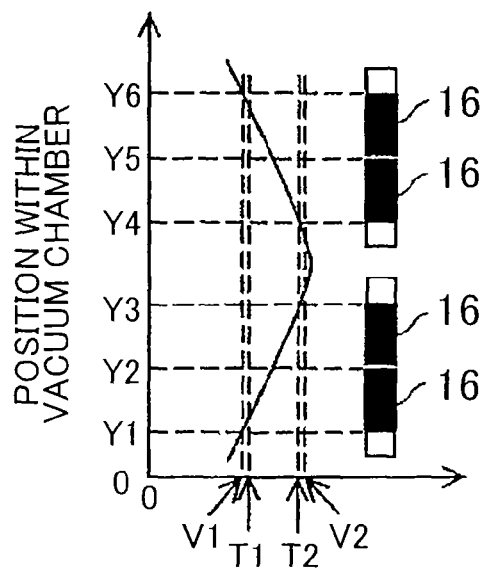
FIG. 8 is a graph showing a relation between film thickness of the DLC film of the male spline section and the axial position in the device shown in FIG. 5.

Next, the film thickness of the DLC film 16c of the first through fourth male spline sections 16 aligned through the same support 114 is described with reference to FIG. 8. In FIG. 8, the vertical axis shows the axial (upward and downward in FIG. 5) position in the vacuum chamber 60, and the horizontal axis shows the thickness of the DLC film 16c of the male spline section 16.

As shown in FIG. 8, when the center of the plasma 70a formed within the vacuum chamber 60 is in the bulged columnar shape, there is a correlation between the size of the bulge of the plasma 70a and the thickness of DLC film 16c. More specifically, as the bulge of the plasma 70a is larger, the DLC film 16c becomes thicker. That is, the film is thickest at the center along the direction that the columnar plasma 70a extends, and the film becomes thinner as the location of the male spline sections 16 approaches the ends of the columnar plasma 70a in the direction that the columnar plasma 70a extends.

As described above, the first through the fourth male spline sections 16 are arranged in the vacuum chamber 60. In other words, male splines formed on the first male spline sections 16 are positioned in a range from Y1 to Y2. Male splines formed on the second male spline sections 16 are positioned in a range from Y2 to Y3. Male splines formed on the third male spline sections 16 are positioned in a range from Y4 to Y5. Male splines formed on the fourth male spline sections 16 are positioned in a range from Y5 to Y6. The spacers 150 are positioned in the range from Y3 to Y4. That is, the spacers 150 are disposed at a position that the center of columnar plasma 70a extends in the extending direction of the columnar plasma 70a.

Accordingly, the thickness of the DLC film 16c on the first and second male spline sections 16 falls within a range from T1 to T2. Similarly, the thickness of the DLC film 16c on the third and fourth male spline sections 16 falls within the same range from T1 to T2. Here, T1 is equal to or greater than V1 which is the minimum required film thickness. Also, T2 is equal to or less than a film thickness of V2 which is the maximum required film thickness. Assuming that the male spline sections 16 are positioned and the DLC film 16c is formed, no male spline section 16 is positioned in a range where the DLC film 16c becomes thickest. The thicknesses of the thickest part and the parts adjacent to the thickest part of the DLC film 16c are larger than V2 which is the maximum required film thickness. Therefore, it is possible to reduce variations in the thickness of the DLC film 16c when simultaneously forming the DLC film 16c on the male spline sections 16.

In this embodiment, in order to simplify the description, the film thickness at Y1 and the film thickness at Y6 are both described as T1, and the film thickness at Y3 and the film thickness at Y4 are described as T2. However, each of these values may be respectively different value, and these values are normally different values respectively. The film thickness at Y1 and the film thickness at Y6 may be equal to or greater than V1 as the minimum required film thickness, and the film thickness at Y3 and the film thickness at Y4 may be equal to or less than V2 as the maximum required film thickness. That is, the film thickness of the DLC film 16c for the first, second, third, and the fourth male spline sections 16 may be equal to or greater than V1 as the minimum required film thickness, and further may be equal to or less than V2 as the maximum required film thickness.

An even number of the male spline sections 16 are inserted into the support 114, and the same number of male spline sections 16 are positioned on both sides of the spacer 150. Therefore, variations in the thickness of the DLC film 16c can be reduced and both end sides of the plasma 70a can effectively be used. In other words, many male spline sections 16 can be placed within the vacuum chamber 60 and the DLC film 16c can be formed on the many male spline sections 16.

In particular, the many male spline sections 16 can be placed within the vacuum chamber 60 by separating the first shaft 10 into the first yoke 11 and the male spline section 16, and placing just the male spline sections 16 within the vacuum chamber 60. Moreover, a larger number of the male spline sections 16 can be securely placed within the vacuum chamber 60 by placing the two male spline sections 16 in direct contact with each other, at a position other than the center of the plasma 70a in the direction that the columnar plasma 70a extends.

In the above embodiment, the four male spline sections 16 are inserted into the supports 114. However, the two male spline sections 16 may be inserted, and the six or more even-numbered male spline sections 16 may be inserted.

Next, the method for forming the DLC film 16c in the second embodiment is described. In the present embodiment, the object for processing placed within the vacuum chamber 60 is the first shaft 10 shown in FIG. 2. That is, the first shaft 10 formed from the first yoke section 11 and the male spline section 16 is placed as an integrated piece into the vacuum chamber 60.

Figure 9:
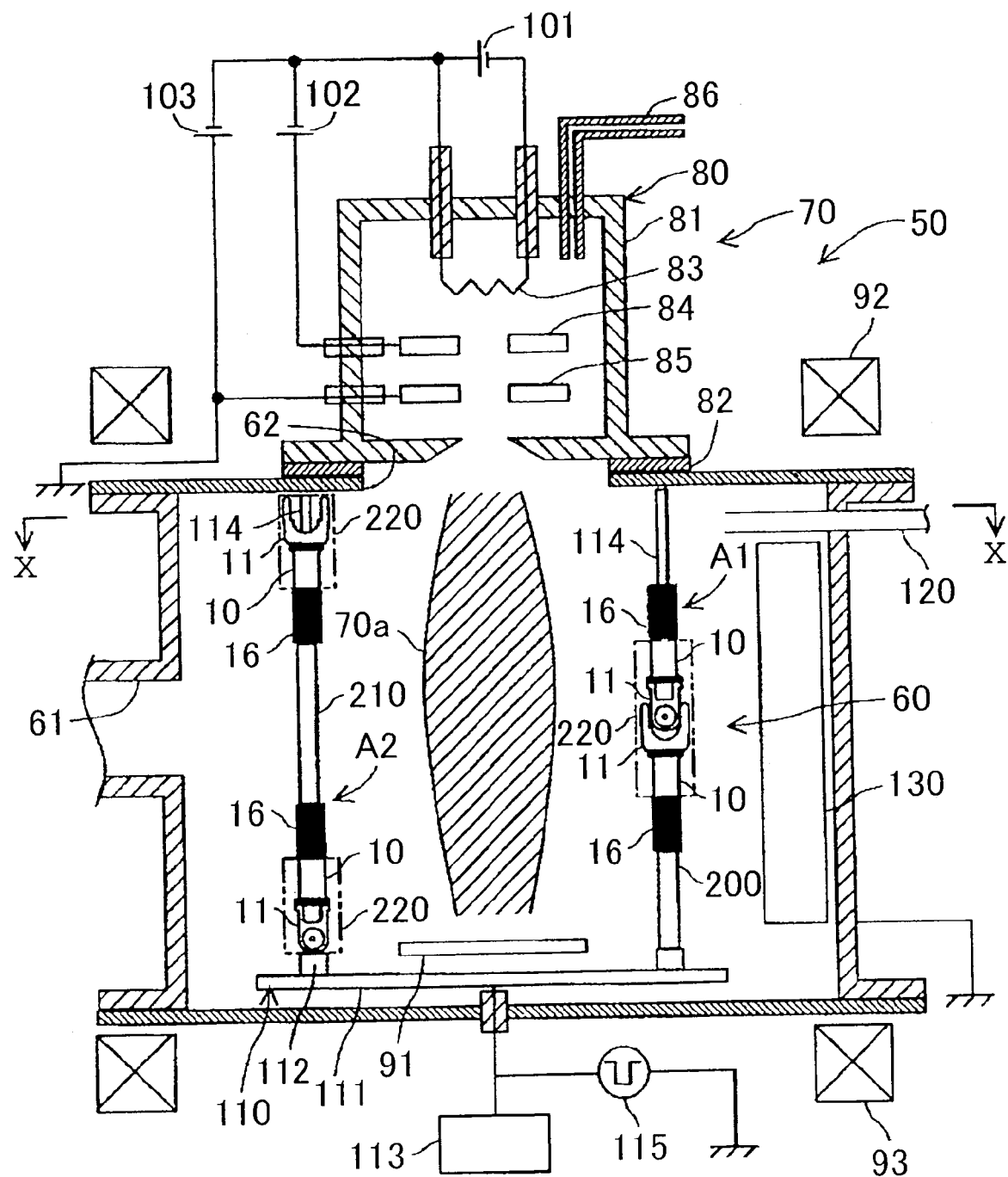
FIG. 9 is a view showing the hot cathode PIG plasma device of the second embodiment for performing the surface treatment of the male spline section containing the integrated first shaft shown in FIG. 2.

As shown in FIG. 9, the two first shafts 10 are inserted into one support 114. Here, the method for inserting the two first shafts 10 groups two first shafts 10 into a first group A1, and groups two first shafts 10 into a second group A2.

The two first shafts 10 serving as the first group A1 are aligned in the direction that the columnar plasma 70a extends such that the respective first yoke sections 11 face each other and overlap in the axial direction of the two first shafts. More specifically, each of the first yoke sections 11 is arranged with mutually shifting 90 degrees. In other words, both yoke sections of universal joints are arranged closer to each other. That is, each of the first yoke sections 11 is placed in the space between the male spline sections 16 of the two first shafts 10 of the first group A1 in the axial direction of the first shafts 10. First, a spacer 200 is inserted in the support 114, and then two first shafts 10 are inserted. The length of the spacers 200 is adjusted so that the space between male spline sections 16 in the axial direction is positioned at the center of the columnar plasma 70a in the direction that the columnar plasma 70a extends. The first group A1 is arranged on every other second rotating stand 112 in the circumferential direction of the first rotating stand 111.

Figure 10:
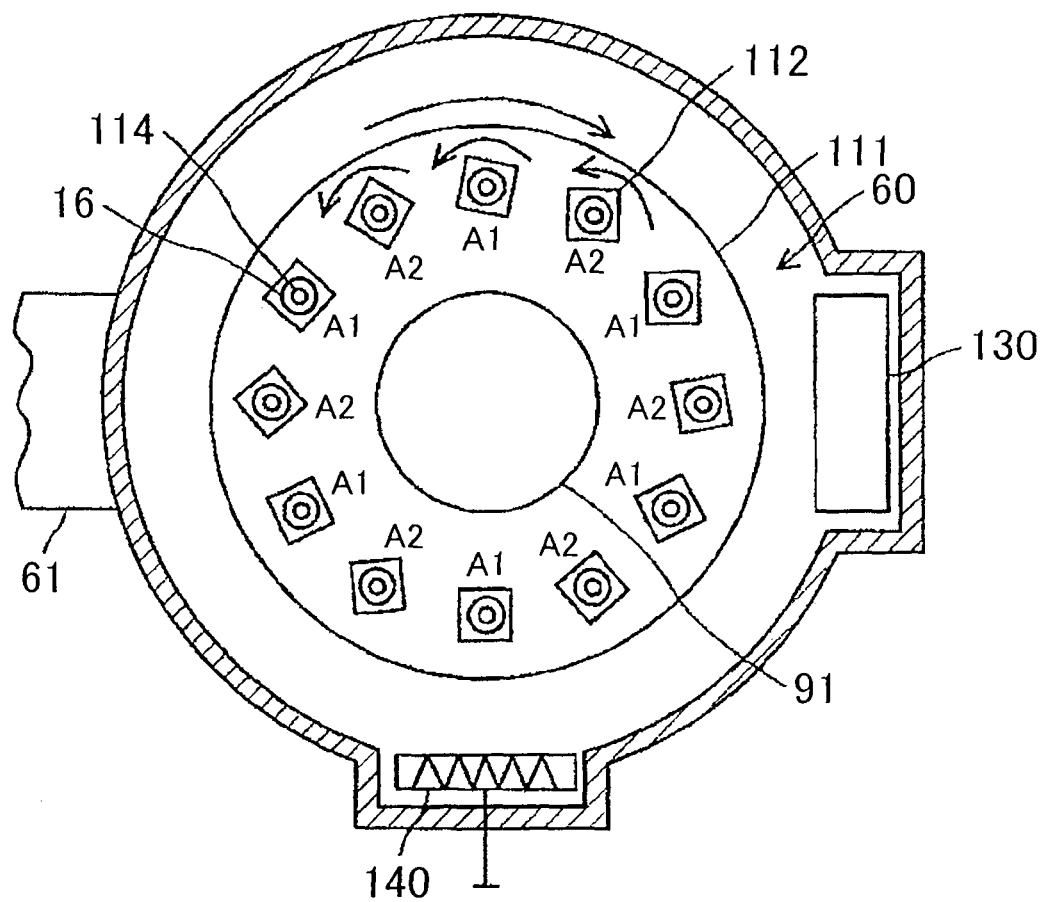
FIG. 10 is a radial cross sectional view of the hot cathode PIG plasma device taken along the line X-X of the cross sectional view in FIG. 9.

The two first shafts 10 serving as the second group A2 are aligned in the direction that the columnar plasma 70a extends such that the respective first yoke sections 11 face outwards. A spacer 210 is disposed in the space between the two first shafts 10 of the second group A2 in the axial direction of the first shafts 10. The axial length of this spacer 210 is set so that the male spline sections 16 of the first group A1 and the male spline sections 16 of the second group A2 are set at the same position in the direction that the columnar plasma 70a extends. That is, the center of the spacer 210 in the axial direction is positioned at the center of the columnar plasma 70a in the direction that the columnar plasma 70a extends. The second group A2 is arranged on every other second rotating stand 112 in the circumferential direction of the first rotating stand 111. That is, as shown in FIG. 10, the first group A1 and the second group A2 are alternately arranged around the plasma 70a in the circumferential direction of the first rotating stand 111.

Figure 11:
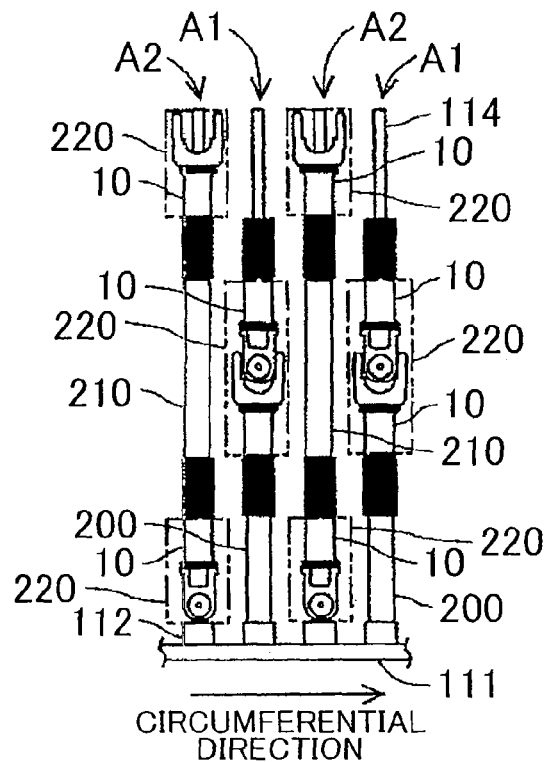
FIG. 11 is a placement view of a state where the plural first shafts positioned within the vacuum chamber in the device shown in FIG. 9 and FIG. 10 are deployed in the circumferential direction.

Also, a mask member 220 covers the respective first yoke sections 11 within the vacuum chamber 60 to prevent processing of the surface of the first yoke sections 11. In FIG. 9 and FIG. 11, the mask members 220 are shown by the dashed lines.

Figure 12:
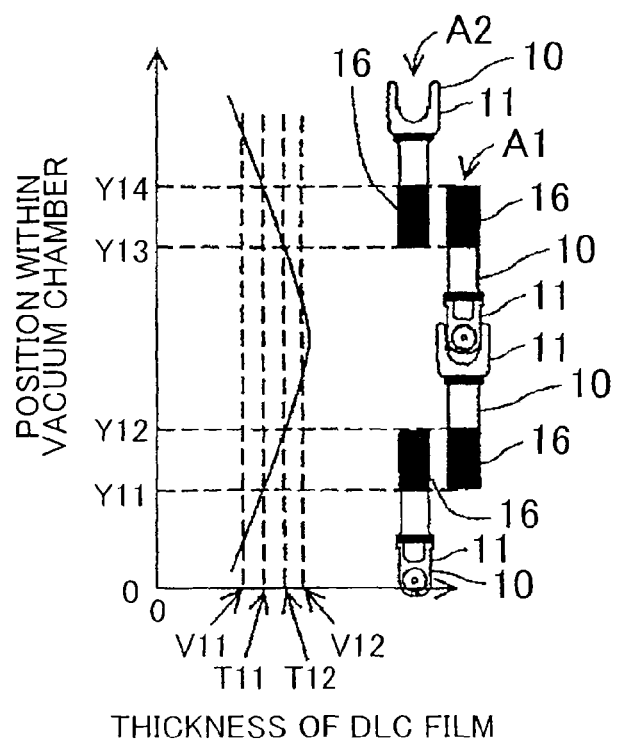
FIG. 12 is a graph showing the relation between the film thickness of the DLC film in the male spline section and the axial position in the device shown in FIG. 9.

Next, the thickness of the DLC film 16c of the male spline section 16 of the two first shafts 10 aligned through the same support 114 is described with reference to FIG. 12. In FIG. 12, the vertical axis shows the axial (upwards and downwards in FIG. 9) position in the vacuum chamber 60, and the horizontal axis shows the thickness of the DLC film 16c of the male spline section 16.

As shown in FIG. 12, the male spline formed on the first male spline sections 16 are positioned in a range from Y11 to Y12. Male splines formed on the second male spline sections 16 are positioned in a range from Y13 to Y14. The first yoke sections 11 positioned at the space between the male spline section 16 of the two first shafts 10 of the first group A1 in the axial direction of the two first shafts 10, is positioned within a range from Y12 to Y13. That is, the first yoke sections 11 are positioned in the center of the columnar plasma 70a in the direction the columnar plasma 70a extends. The spacer 210 positioned at the space between the two first shafts 10 of the second group A2 in the axial direction is positioned within the range from Y12 to Y13.

Accordingly, the thickness of the DLC film 16c of the male spline section 16 of the two first shafts 10 falls within a range from T11 to T12. Here, T11 is equal to or greater than V1 which is the minimum required film thickness. Also, T12 is equal to or less than a film thickness of V2 which is the maximum required film thickness. Assuming that the male spline sections 16 are positioned and the DLC film 16c is formed, no male spline section 16 is positioned in a range where the thickness of the DLC film 16c becomes thickest. The thicknesses of the thickest part and the parts adjacent to the thickest part section of the DLC film 16c are larger than V12 which is the maximum required film thickness. Therefore, it is possible to reduce variations in the thickness of the DLC film 16c when simultaneously forming the DLC film 16c on the male spline sections 16.

In this embodiment, in order to simplify the description, both the film thickness at Y11 and the film thickness at Y14 are described as T11, and both the film thickness at Y12 and the film thickness at Y13 are described as T12. However, each of these values may be respectively different value, and these values are generally different values respectively. The film thickness at Y11 and the film thickness at Y14 may be equal to or greater than V11 which is the minimum required film thickness, and the film thickness at Y12 and the film thickness at Y13 may be equal to or less than V12 which is the maximum required film thickness. That is, the film thickness of the DLC film 16c for the first and the second male spline sections 16 of the first group A1, and also for the first and second male spline section 16 of the second group A2 is equal to or greater than the minimum required film thickness of V11, and further is equal to or less than V12 which is the maximum required film thickness.

Because there is no need to form a DLC film on the first yoke section 11, the region of the first yoke sections 11 within the vacuum chamber 60 is wasted. However, because the respective first yoke sections 11 of the plural first shafts 10 are aligned such that the respective first yoke sections 11 face each other and overlap in the axial direction, regions that forming of a DLC film is not required can be narrowed as much as possible. Moreover, by positioning the overlapping sections of the respective first yoke sections 11 facing each other at the center of the columnar plasma 70a in the direction which the columnar plasma 70a extends, the axial gaps between the plural male spline sections 16 can be effectively utilized. Since the interior of the vacuum chamber 60 can be effectively utilized, the variations in the thickness of the DLC film 16c can be reduced and many first shafts 10 can be placed within the vacuum chamber.

Moreover, by setting the two first shafts 10 adjacent to the two first shafts 10 of the first group A1 in the circumferential direction as the second group A2, it is possible to prevent that the first yoke sections 11 of the first group A1 contact with the first yoke sections 11 of the first group A2 circumferentially. In other words, the gap between the first group A1 and the second group A2 in the circumferential direction can be narrowed by placing the first group A1 and the second group A2 within the vacuum chamber 60 at alternate positions in the circumferential direction.

While the invention has been described with reference to example embodiments thereof, it is to be understood that the invention is not limited to the example described in the embodiments or constructions. To the contrary, the invention is intended to cover various modifications and equivalent arrangements. In addition, while the various elements of the example embodiments are shown in various combinations and configurations, including more, less or only a single element, are also within the scope of the invention.

What is claimed is:

1. A method for forming a DLC film on a male spline section of a spline shaft by a hot cathode PIG plasma CVD device, wherein the hot cathode PIG plasma CVD device includes: i) a vacuum chamber that accommodates the spline shaft; ii) a plasma gun; iii) a reflecting electrode arranged within the vacuum chamber; iv) a first coil arranged to surround the plasma gun; v) a second coil arranged on the reflecting electrode side, the second coil facing the first coil; vi) a hot cathode PIG plasma source that forms a columnar plasma with a bulged center in the vacuum chamber; and vii) a material gas feed section that supplies material gas into the vacuum chamber, the material gas serving as a material for the DLC film, the method comprising:
arranging the plural spline shafts around the columnar plasma in the vacuum chamber;
aligning the plural spline shafts coaxially on a support having a longitudinal axis that extends in a same direction that the columnar plasma extends;
arranging the plural coaxially aligned spline shafts so that two of the plural coaxially aligned spline shafts are located near a center of the longitudinal axis of the support and are positioned so as to form an axial gap between the respective male spline sections of the two spline shafts near the center; and
positioning the axial gap such that a center of the axial gap is positioned at the center of the longitudinal axis of the support and the center of the axial gap is also positioned at a center of the columnar plasma in the direction that the columnar plasma extends,
wherein the two coaxially aligned spline shafts are located on either side of the axial gap and are positioned a same distance away from the center of the axial gap along the longitudinal axis.

2. The method according to claim 1, wherein an even number of the plural spline shafts are aligned in the vacuum chamber in the direction that the columnar plasma extends.

3. The method according to claim 2, wherein the spline shaft includes: i) the male spline section; and ii) a yoke section formed in a U-shape, the yoke section being capable of coupling to other member, and the yoke section being joined with the male spline section into one piece after being formed as a piece separate from the male spline section,
   only the male spline sections of the spline shafts are placed within the vacuum chamber,
   the four or more male spline sections are aligned within the vacuum chamber in the direction that the columnar plasma extends,
   the two male spline sections that are placed near the center of the columnar plasma in the direction that the columnar plasma extends, are positioned so as to form an axial gap between the two male spline sections, and
   the two male spline sections that are positioned outside the center of the columnar plasma in the direction that the columnar plasma extends are positioned in a manner to abut with each other.

4. The method according to claim 1, wherein the spline shaft includes the male spline section, and a U-shaped yoke section that is coupled to other member and integrally formed into one piece with the male spline section,
   the plural spline shafts aligned in the direction that the columnar plasma extends within the vacuum chamber are arranged such that the respective yoke sections face and overlap each other in an axial direction, and
   the respective yoke sections are placed at the axial gap between the respective male spline sections that is positioned at the center of the columnar plasma in the direction that the columnar plasma extends.

5. The method according to claim 4, wherein the plural spline shafts that are aligned in the direction that the columnar plasma extends such that the respective yoke sections face each other are a first group;
   the plural spline shafts that are aligned in the direction that the columnar plasma extends such that the respective yoke sections face outwards are a second group; and
   the first group and the second group are alternately arranged in the circumferential direction around the columnar plasma.

6. The method according to claim 5, wherein the male spline sections of the first group and the male spline sections of the second group are arranged at same position in the direction that the columnar plasma extends.

* * * * *